United States Patent
Reddy et al.

(10) Patent No.: US 12,266,535 B2
(45) Date of Patent: Apr. 1, 2025

(54) MASK ENCAPSULATION TO PREVENT DEGRADATION DURING FABRICATION OF HIGH ASPECT RATIO FEATURES

(71) Applicant: Lam Research Corporation, Fremont, CA (US)

(72) Inventors: Kapu Sirish Reddy, Portland, OR (US); Jon Henri, West Linn, OR (US); Francis Sloan Roberts, Portland, OR (US)

(73) Assignee: LAM RESEARH CORPORATION, Fremont, CA (US)

( * ) Notice: Subject to any disclaimer, the term of this patent is extended or adjusted under 35 U.S.C. 154(b) by 371 days.

(21) Appl. No.: 17/642,918

(22) PCT Filed: Sep. 23, 2020

(86) PCT No.: PCT/US2020/052181
§ 371 (c)(1),
(2) Date: Mar. 14, 2022

(87) PCT Pub. No.: WO2021/067092
PCT Pub. Date: Apr. 8, 2021

(65) Prior Publication Data
US 2022/0406610 A1 Dec. 22, 2022

Related U.S. Application Data

(60) Provisional application No. 62/909,073, filed on Oct. 1, 2019.

(51) Int. Cl.
*H01L 21/02* (2006.01)
*C23C 16/26* (2006.01)
(Continued)

(52) U.S. Cl.
CPC .......... *H01L 21/3086* (2013.01); *C23C 16/26* (2013.01); *H01L 21/02274* (2013.01);
(Continued)

(58) Field of Classification Search
CPC ............... H01L 21/3086; H01L 21/308; H01L 21/02274; H01L 21/02; H01L 21/0335;
(Continued)

(56) References Cited

U.S. PATENT DOCUMENTS

2007/0111373 A1    5/2007  Ueda
2008/0188082 A1    8/2008  Chi et al.
(Continued)

FOREIGN PATENT DOCUMENTS

| CN | 104425222 | 3/2015 |
| CN | 106067513 A | 11/2016 |
| KR | 10-2009-0016841 | 2/2009 |

OTHER PUBLICATIONS

International Search Report from International Application No. PCT/US2020/052181 dated Jan. 26, 2021.
(Continued)

*Primary Examiner* — Nikolay K Yushin
(74) *Attorney, Agent, or Firm* — Alleman Hall & Tuttle LLP

(57) ABSTRACT

A tool and method for processing substrates by encapsulating a mask to protect from degradation during an etch-back to prevent a feature liner material from pinching off an opening during deposition-etch cycles used to fabricate high aspect ratio features with very tight critical dimension control.

20 Claims, 7 Drawing Sheets

(51) Int. Cl.
 *H01L 21/033* (2006.01)
 *H01L 21/308* (2006.01)
 *H01L 23/29* (2006.01)

(52) U.S. Cl.
 CPC ...... *H01L 21/0335* (2013.01); *H01L 21/0337* (2013.01); *H01L 23/298* (2013.01)

(58) Field of Classification Search
 CPC ............ H01L 21/0337; H01L 21/3085; H01L 21/67069; H01L 21/67; H01L 21/02115; H01L 21/0332; H01L 21/033; H01L 21/3065; H01L 21/3081; H01L 23/298; H01L 23/29; H01L 23/31; H01L 23/481; H01L 23/5286; C23C 16/505; C23C 16/26; C23C 16/50; C23C 16/00
 See application file for complete search history.

(56) References Cited

U.S. PATENT DOCUMENTS

2014/0295668 A1 10/2014 Avasarala
2017/0125255 A1 5/2017 Kakimoto et al.

OTHER PUBLICATIONS

Written Opinion from International Application No. PCT/US2020/052181 dated Jan. 26, 2021.

MASK ENCAPSULATION TO PREVENT DEGRADATION DURING FABRICATION OF HIGH ASPECT RATIO FEATURES

CROSS REFERENCE TO RELATED APPLICATION

This application claims the benefit of priority of U.S. Application No. 62/909,073, filed Oct. 1, 2019, which is incorporated herein by reference for all purposes.

FIELD OF THE INVENTION

The present application is directed to processing substrates, and more particularly, to encapsulating a mask to protect from degradation during deposition-etch cycles used to fabricate high aspect ratio features with very tight critical dimension control.

DESCRIPTION OF RELATED ART

Fabrication of certain semiconductor devices often involves vertical etching features into a layer or a stack of layers of various materials. The various materials may include, but are not limited to, silicon nitride, silicon oxide, polysilicon, boron doped oxides, other oxides, Ashable HardMasks (AHMs), carbon masks, etc.

The features that are commonly vertically etched into a single layer or a stack of layers may widely vary in shape. Common features typically include, but are not limited to, cylinders, holes, trenches, slits and other geometric or non-geometric shapes.

The aspect ratio of a given vertical etched feature is defined by its depth divided by its width. A high aspect ratio cylinder, for example, is characterized by a relatively small diameter (i.e., width) relative to a relatively deep depth. A high aspect ratio trench is defined as having a relatively deep depth and a relatively narrow side-wall to side-wall width.

With certain types of semiconductor devices, the fabrication of high aspect ratio features is critical. With 3D NAND memory devices for instance, it is desirable to fabricate cylinders, trenches and other features having very high aspect ratios that span in depth multiple stacked layers on the device. With current fabrication processes, however, fabricating extremely high aspect ratio features is difficult.

During a deep vertical etch, the side walls of a feature are unavoidably etched. This lateral etch undesirably increases the width of the feature, decreasing the aspect ratio, as well as possibly causing the sidewalls to twist and/or bow. The degree of lateral etching, twisting, and/or bowing is characterized by the Critical Dimension or "CD" measure of the feature. In general, the smaller the CD of a feature, the better.

To improve the CD measure, the use of a lateral etch barrier or "liner" on the sidewalls of a feature is known. These sidewall liners are typically either a metal-based material (e.g., tungsten carbide or "WC") or a carbon-based polymer that acts as a barrier to mitigate lateral etching during vertical etching. While these liners work to a degree, they have some drawbacks. If the liner material is highly resistant to the fluorine, chlorine, and/or bromine-based etch chemistries, the liner material may interact with the vertical etch process to cause striations and kinking, often resulting in undesirable, uneven, rough vertical grooves in the sidewalls, an uneven re-entrant profile, and irregularities in the hole on the planar surface of the layer or stack of layers in which the feature is vertical etched. If the liner material is not highly resistant to the etch chemistries, the protection against bowing may be insufficient or inadequate.

The above issues are problematic for several reasons. First, with potentially insufficient insulation between features due to bowing, electrical shorting between features may occur. Second, to avoid the possibility of electrical shorting, it is prudent to space the features farther apart from one another than is typically desired. As a result, certain semiconductor devices are less dense than they possibly could be for a given process technology. Third, the surface irregularities of the entrant hole, on the sidewalls and at the bottom of features, provide poor contact surfaces and make it more difficult to deposit other films and/or materials into the features.

Conventional metal-based or carbon-based polymer liners are therefore inadequate when pushing the boundary when vertically etching high aspect ratio features. For next generation process technologies, a new process for fabricating deep features in semiconductor structures having extremely high aspect ratios and tight critical dimension control, is therefore needed.

SUMMARY

The present application is directed to a semiconductor process for fabricating deep features having extremely high aspect ratios and tight critical dimension control (CD).

In one non-exclusive embodiment, the invention is directed to a method of fabricating a semiconductor substrate including (a) vertical etching a feature having sidewalls and a depth into one or more layers formed on the semiconductor substrate and (b) depositing an amorphous carbon liner onto the sidewalls of the feature.

The invention is further directed to, in certain non-exclusive embodiments, iterating (a) and optionally (b), until the feature has reached a desired depth. With each iteration of (a), the feature is vertical etched deeper into the one or more layers, while the amorphous carbon liner resists lateral vertical etching of the sidewalls of the feature. With each optional iteration of (b), the deposited amorphous carbon liner on the sidewalls of the feature is replenished.

The invention is further directed to, in yet other non-exclusive embodiments, fabricating a feature into a semiconductor substrate by:
 (a) Encapsulating the top surface, opening and sidewalls (i.e., the "neck") of a mask defining a feature nominally etched into the semiconductor substrate with an etch-resistant material;
 (b) Depositing an amorphous carbon liner on the sidewalls of the mask and sidewalls of the etched feature;
 (c) Performing an amorphous carbon liner etch for removing excess amorphous carbon that may have deposited around the opening, sidewalls and/or neck of the mask during the deposition of the amorphous carbon liner; and
 (d) Performing a feature etch to deepen the depth of the feature into the semiconductor substrate.

With variations of the above-defined embodiment, each of the steps (a) through (d) may be individually or collectively repeated as needed or desired. By selectively performing the steps (a)-(d) a number of advantages can be realized. First, by encapsulating the mask with the etch-resistant material, the amorphous carbon liner etch may occur for a longer period of time before degradation of the mask. As a result, excess amorphous carbon deposits in the opening of the mask can be removed, providing an ideal entry profile for the feature to be etched. Second, with a better mask entry profile, the amorphous carbon liner can be deposited deeper into the feature and more uniformly on the sidewalls of the feature. Third, with a better profile of the amorphous carbon liner, the feature etch can be performed for a longer period of time before the amorphous carbon liner needs to be replenished. As a result, features can be etched deeper, with tighter CD control, in possibly fewer iterations.

The use of an amorphous carbon liner is advantageous for a number of reasons. Amorphous carbon is highly resistant to the fluorine, chlorine, and/or bromine chemistries that are commonly used for the vertical etching of features. With an amorphous carbon liner on the sidewalls, laterally etching is significantly mitigated or eliminated. In addition, the deposition process can be readily controlled, meaning the amorphous carbon liner can be tailored to meet specific desired specifications, such as material thickness, uniformity, composition, conformality, etc. As a result:

(a) Lateral etching is minimized during vertical etching, preventing bowing of the sidewalls and/or surface irregularities of the hole on the top surface of the one or more layers defining the feature;

(b) Issues of striations, kinking, uneven, rough, vertical surfaces, grooves and other surface irregularities in the sidewalls are mitigated or altogether eliminated; and (c) Highly dense, deep, features, with extremely high aspect ratios, and tight CD control, suitable for next generation process technologies and semiconductor devices, can be achieved.

In yet other embodiments, the above described depositions and etching are performed in a single substrate processing tool with the ability to perform both depositions and etching. In alternative embodiments, the depositions and etchings can be performed in a single tool having separate deposition and etching processing chambers, or in two separate deposition and etching tools. In the later two embodiments, substrates need to be transported between the different processing chambers.

In yet other embodiments, the features fabricated as described herein may assume a wide variety of shapes and sizes, including but not limited to cylinders, holes, trenches, slits and other geometric or non-geometric shapes.

BRIEF DESCRIPTION OF THE DRAWINGS

The present application and the advantages thereof, may best be understood by reference to the following description taken in conjunction with the accompanying drawings in which.

In the drawings, like reference numerals are sometimes used to designate like structural elements. It should also be appreciated that the depictions in the Figures are diagrammatic and not necessarily to scale.

DETAILED DESCRIPTION

The present application will now be described in detail with reference to a few non-exclusive embodiments thereof as illustrated in the accompanying drawings. In the following description, numerous specific details are set forth in order to provide a thorough understanding of the present disclosure. It will be apparent, however, to one skilled in the art, that the present discloser may be practiced without some or all of these specific details. In other instances, well known process steps and/or structures have not been described in detail in order to not unnecessarily obscure the present disclosure.

In a first non-exclusive embodiment, the present application is directed to a semiconductor process for fabricating deep features having extremely high aspect ratios and tight critical dimension control (CD). In one non-exclusive embodiment, the invention is directed to a method of fabricating a semiconductor substrate including (a) vertical etching a feature having sidewalls and a depth into one or more layers formed on the semiconductor substrate and (b) depositing an amorphous carbon liner onto the sidewalls of the feature.

The invention further is directed to, in certain non-exclusive embodiments, iterating (a) and optionally (b), until the vertical etch feature has reached a desired depth. With each iteration of (a), the feature is vertical etched deeper into the one or more layers, while the amorphous carbon liner resists lateral etching of the sidewalls of the feature. With each optional iteration of (b), the deposited amorphous carbon liner on the sidewalls of the feature is replenished.

Process Flow Diagram

Figure 1:
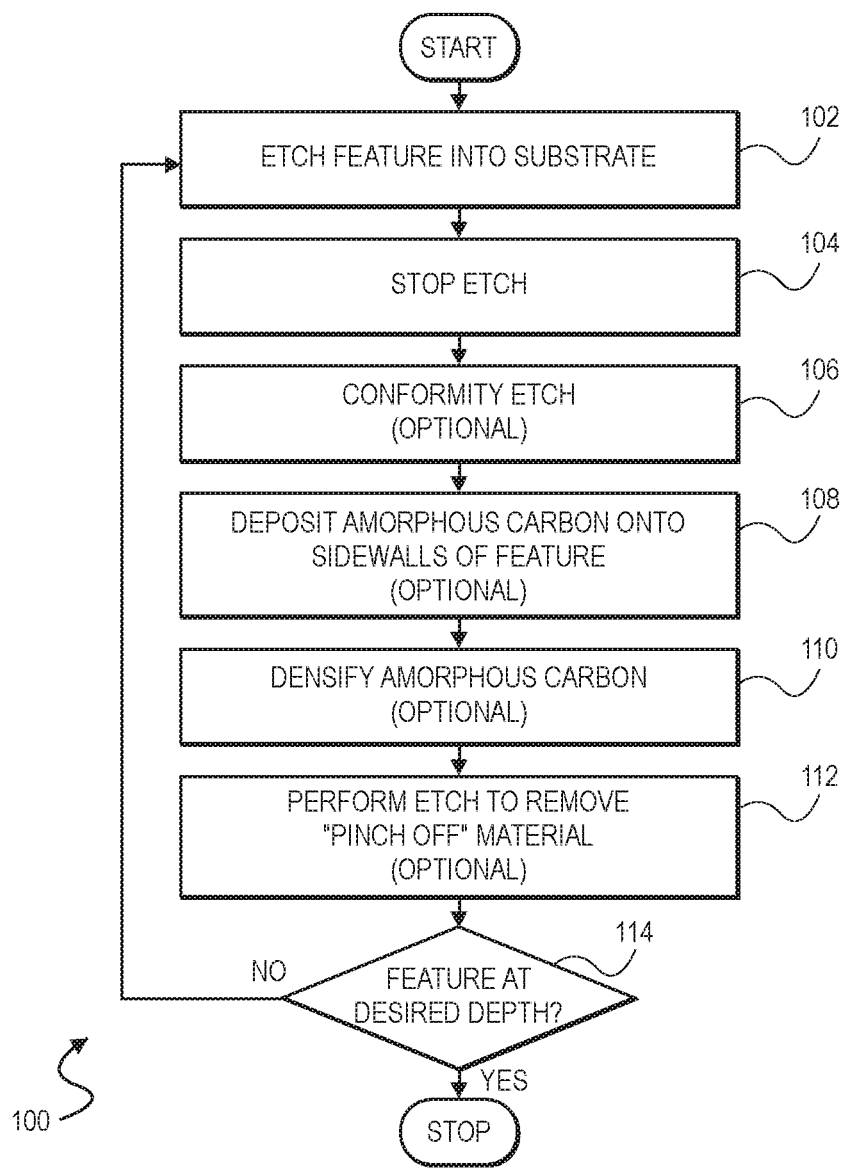
FIG. 1 is flow diagram illustrating processing steps for fabricating one or more features on a semiconductor substrate in accordance with a non-exclusive embodiment of the present invention.

Referring to FIG. 1, a flow diagram 100 illustrating the iteration of the processing steps (a) and (b) as defined above for fabricating one or more vertical etched features in one or more layers formed on a semiconductor substrate is shown.

In initial step 102, a nominal or "starter" vertical etch is performed to create one or more features on the semiconductor substrate.

In step 104, the nominal vertical etch is stopped. In a non-exclusive embodiment, the depth of the nominal vertical etch is in the range of 3 to 4 microns. It should be understood that this range is merely exemplary. A nominal vertical etch that is either deeper or less deep may be performed.

In an optional step 106, a conformity etch is performed. The objective of the conformity etch is to open and/or control the CD of the one or more holes defining the one or more vertical features etched into the semiconductor substrate. By opening and/or controlling the CD of the hole(s), the upper sidewall regions of the features are prevented from becoming closed off, preventing a condition known as "capping" or "pinch off" from occurring. If a given hole becomes closed off or is too small, it may become clogged, "capping" or "pinching off" the top of the feature with polymer material during a subsequent vertical etch. Also, by opening and/or controlling the CD of the holes of the features, the subsequent deposition of amorphous carbon will tend to be more conformal. The conformity etch may be performed using a number of different chemistries, including but not limited oxygen ($O_2$), nitrous oxide ($N_2O$), carbon dioxide ($CO_2$), hydrogen ($H_2$), and/or any other inert gas, or any mixture or combination thereof.

In step 108, the amorphous carbon liner is deposited on the sidewalls of the one or more features, generally extending from the top of the opening down to the bottom depth of the one or more features. In various embodiments, the thickness of the amorphous carbon liner ranges from 5 to 500 Angstroms. It should be understood that this range is merely exemplary. The amorphous carbon liner can be made either thinner or thicker.

In optional step 110, the deposited amorphous carbon liner is "densified". By making the amorphous carbon liner more dense, it extends its useful life before replenishing is needed. The densifying of the amorphous carbon liner can be accomplished by compacting the amorphous carbon liner, purging hydrogen from the amorphous carbon liner or a combination of both. For example, by exposing the semiconductor substrate to a Radio Frequency (RF) plasma with an inert plasma chemistry (e.g., argon, dinitrogen, helium, etc.) or a hydrogen plasma, the amorphous carbon liner can be compacted and hydrogen removed, both of which result in densification.

In another optional step 112, an etch-back is performed to remove excessive amorphous carbon that may deposit (i) on the planar surface of the one or more layers around or adjacent to the hole(s) defining the one or more features and (ii) on the sidewalls of the one or more features. By removing these excess deposits, "pinch off" conditions are avoided that may partially or fully block or close the width of a given feature. If pinch off occurs, the chemistry in a subsequent vertical etch may be prevented from reaching the depth of the features, inhibiting the vertical etch. Also, with the ability to remove any excess deposition material from sidewalls, a final feature with improve the CD tightness typically results. The etch back may be performed using a number of different chemistries, including but not limited to those including oxygen ($O_2$), nitrous oxide ($N_2O$), carbon dioxide ($CO_2$), hydrogen ($H_2$), nitrogen ($N_2$), or any mixture or combination thereof.

In step 114, it is determined if the feature has been vertical etched to its desired depth. If yes, then the above-described process is complete. If not, the above steps 102-112 are repeated, including the vertical etch start and stop steps 102, 104, and any of the optional steps 106-112.

With each iteration of the vertical etch step 102, a number of factors may be considered before stopping the vertical etch in step 104. One significant factor is the condition of the amorphous carbon liner. While amorphous carbon is generally highly resistant to fluorine, chlorine and/or bromine, it is not entirely impervious to these etching chemistries. Factors such as the thickness of the amorphous carbon liner, the lateral etch rate of the amorphous carbon liner versus the rate at which the feature is vertically etched and other criteria can all be used to determine when to stop a vertical etch and to replenish the amorphous carbon liner. With very deep features (e.g., of 4 microns of depth or more), multiple iterations of (a) vertical etchings and (b) depositions may be required.

It is noted that the step 108 is listed as "optional". As a general rule, the amorphous carbon liner is deposited almost always following the nominal first vertical etch. This way, the sidewalls of the one or more features are subject to minimal laterally etching during a subsequent vertically etching step (a). At some point, after one or more iterative vertical etching(s) (a), the feature(s) reach their desired vertical depth. When this occurs, replenishing the amorphous carbon liner may be unnecessary or undesirable. In which case, the deposition step 108 may optionally skipped.

Semiconductor Substrate with Vertically Etched Features

Figure 2:
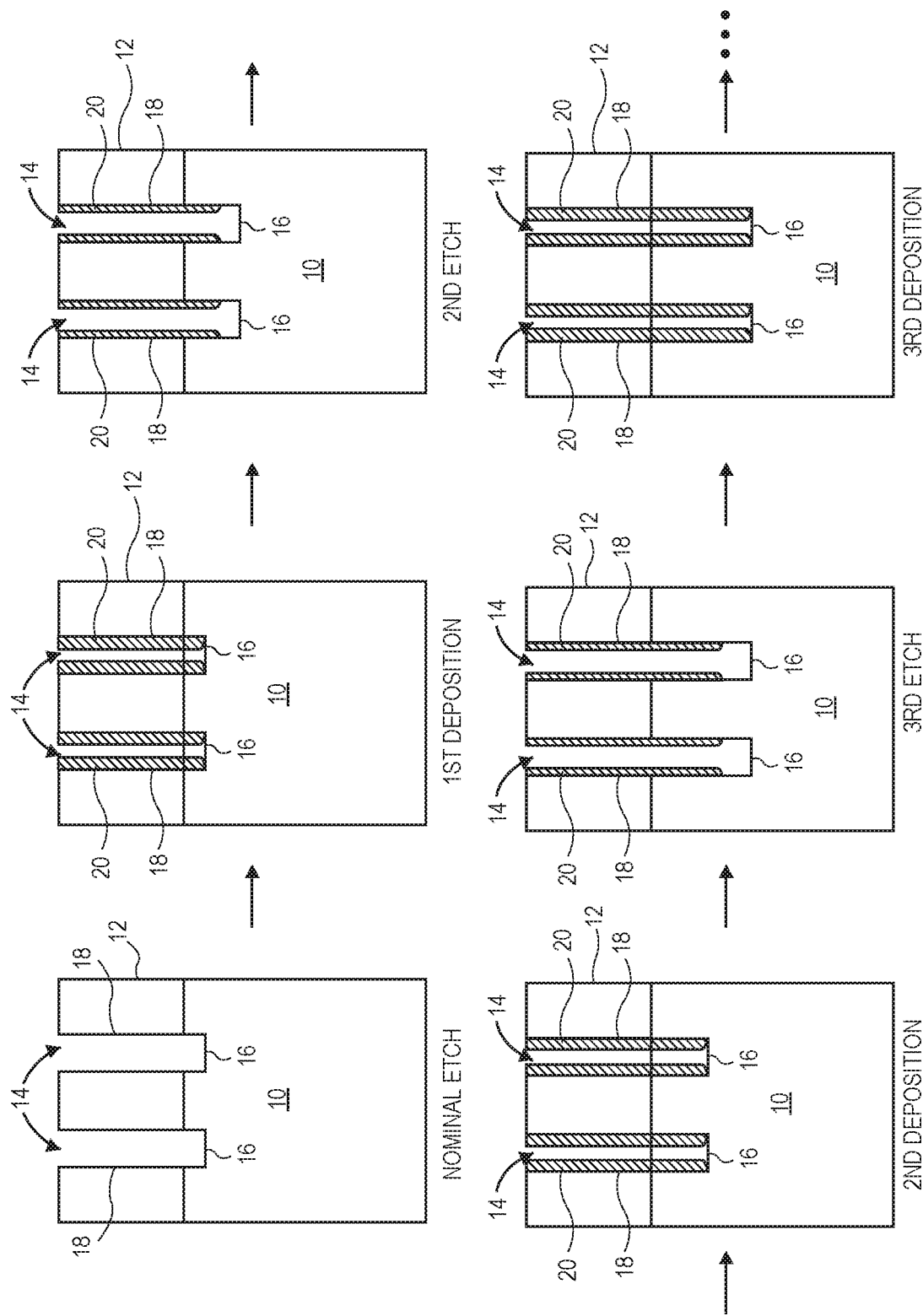
FIG. 2 illustrates several iterations of an (a) vertical etch followed by (b) an amorphous carbon deposition liner during fabrication of one or more features on the semiconductor substrate in accordance with a non-exclusive embodiment of the invention.

Referring to FIG. 2, several iterations of an (a) vertical etch of step 102 followed by (b) an amorphous carbon deposition liner of step 108 during fabrication of one or more features 14 on an exemplary semiconductor substrate 10 is shown. The fabrication of the features 14 on the semiconductor device generally follow the steps outlined above with regard to the flow diagram of FIG. 1. In this particular example, three (3) iterations of (a) vertical etch of step 102 and (b) an amorphous carbon deposition liner of step 108 are performed for the features 14 to reach their desired depth.

The semiconductor substrate 10 includes one or more layers 12. For the sake of simplicity, just one layer 12 is shown. It should be understood that the layer 12 can include multiple stacked layers. The individual layer or layers 12 of the semiconductor substrate 10 may widely vary. Such layer(s) may include, but are not limited to silicon nitride, silicon oxide, polysilicon, an oxide, a doped oxide such boron doped oxide, various spin-on glass materials such as PSG and BPSG, an Ashable HardMask (AHM), material such as carbon or carbon doped with various materials such as boron, or any other type of material or layer that is formed on semiconductor substrates, including those that are currently known or used and those that are discovered or used in the future. It should therefore be understood that this list of materials is not exhaustive.

In the particular embodiment shown, the layer(s) 12 are used as a mask for defining the features 14 to be fabricated into the depth or bulk of the semiconductor substrate 10. Typically, the layer(s) 12 are uniformly deposited onto the underlying surface of the substrate 10. As is well known in the art, the layer(s) 12 are then patterned to expose certain portions of the substrate 10. The patterned layer(s) 12 thus act as a mask for defining the features 14 to be fabricated on the substrate 10.

In a nominal or "starter" vertical etch, as shown two features 14 are defined. Each feature 14 following the nominal etch is defined by a depth 16 and sidewalls 18. For the sake of clarity, a vertical etch is intended to be broadly construed to include any etch into the depth of the exposed regions of the substrate 10 as defined by the pattern mask defined by the layer(s) 12. It should also be understood that for the sake of simplicity, only two features 14 are illustrated. In actual embodiments, a significantly larger number of features 14 may be fabricated on the substrate 10.

In a subsequent first deposition, amorphous carbon liners 20 are formed on the sidewalls 18 of the features 14. The amorphous carbon liners 20 typically extend down to the bottom or near the bottom of the depth 16 of the features 14.

The substrate 10 next undergoes a second vertical etch to extend the depth 16 of the features 14. With the second vertical etch, the amorphous carbon liners 20 no longer reach the bottom depth 16 of the features 14.

In a second deposition, amorphous carbon liners 20 are replenished and extend down to near or at the bottom of the depth 16 of the features 14 as defined by the second vertical etch.

In a third iteration, the features 14 are again vertically etched. In this particular example, the depth 16 after the third vertical etch reaches the desired or target depth. Accordingly, no more vertical etch iterations are required in this example.

In an optional third deposition, the amorphous carbon liners 20 are again replenished. It is noted that this step is optional and may not be implemented as described above.

Although not illustrated in FIG. 2, any of the optional steps may be implemented, including the conformity etch 106, densifying step 110 and/or etch-back 112. In some embodiments, these steps can be performed with each iteration of (a) the vertical etch of step 102 and (b) the deposition of the amorphous carbon liner of step 108. In other embodiments, these steps can be performed with some, but not all of the iterations (a) and/or (b).

It is pointed out that with the second and third iterations, the amorphous carbon liner 20 is shown thicker after a replenishment (b) compared to immediately following each vertical etch (a). It should be understood the diagrams are merely illustrative and are not drawn to scale. With a thickness of the amorphous carbon liners 20 typically in the range of a few angstroms, drawings that are to scale are not plausible.

Only three iterations of (a) vertical etching and (b) deposition have been described and illustrated. It should be understood that any number of iterations may be used. In some cases, fewer iterations may be needed to reach a desired depth 16 of the features 14, while in other cases, more iterations are needed.

Ascertaining the number of iterations of (a) and (b) needed for a given feature 14 is dependent on a wide variety of factors. Such factors may include, but are by no means limited to, the desired depth of the feature, the thickness of the deposited amorphous carbon liner 20, the Critical Dimension (CD) tolerance for the feature 14, a desired aspect ratio of the feature 14, timing when the amorphous carbon liner 20 needs to be replenished and/or any combination thereof. It should be understood that this list of factors is not exhaustive and that others may also be considered.

It should also be understood that the feature 14 can assume a wide variety of shapes. Such shapes may include, but are not limited to, a cylinder, a hole, a trench, a slit, a geometric shape, a non-geometric shape, or just about any other shape that can possibly be fabricated on a semiconductor substrate, such as semiconductor substrate 10.

It is also noted, that in some embodiments, the amorphous carbon liner 20 deposited on the sidewalls 18 of the vertical etched features 14 may possibly be removed during subsequent processing steps of the semiconductor substrate 10. For example, the amorphous carbon liner 20 can be removed during an "ashing" step, which is typically an isotropic etch step.

Simultaneous Etching

As the amorphous carbon liner 20 is formed, there is a tendency for the amorphous carbon material to deposit thicker in the area defined by the mask layer(s) 12 and upper regions of the feature 14 (i.e., the "neck" of the feature 14), while depositing thinner or not at all at the lower depths of the feature 14. As excess amorphous carbon liner material collects in the neck, it partially or fully closes the opening. This condition, referred to as "pinch-off" or "capping", prevents the amorphous carbon material from depositing onto the sidewalls 18 of the lower depths of the feature 14. As a result, the amorphous carbon liner 20 is non-uniform in thickness and may be very thin or non-existent near the bottom of the feature 14.

In co-pending, commonly assigned application U.S. provisional Application 62/856,595, entitled "Carbon Based Liner for Critical Dimension Control During High Aspect Ratio Feature Etches", filed Jun. 3, 2019, a process for performing a localized etch at the entry or neck of the feature 14 to mitigate pinch off conditions is described. By performing the localized etch, the neck features 14 remain open at least for a longer period of time, allowing the amorphous carbon material to deposit on the lower depths of the feature 14. As a result, uniformity and depth of the amorphous carbon liner 20 deposition is improved. In variations of this approach, the etch can occur during, just before, just after, the amorphous carbon deposition. U.S. provisional application 62/856,595 is incorporated by reference herein for all purposes.

While localized etch works relatively well in delaying a preventing pinch off condition, it does have its limitations. Namely, if the localized etch is performed for too long a period, the exposed layer(s) 12 may be inadvertently etched as well, degrading the mask. With the etching of the layer(s) 12, the shape of the mask may be detrimentally altered, and any underlying layers in the stack may be damaged and/or degraded.

Mask Encapsulation to Prevent Degradation

Figure 3:
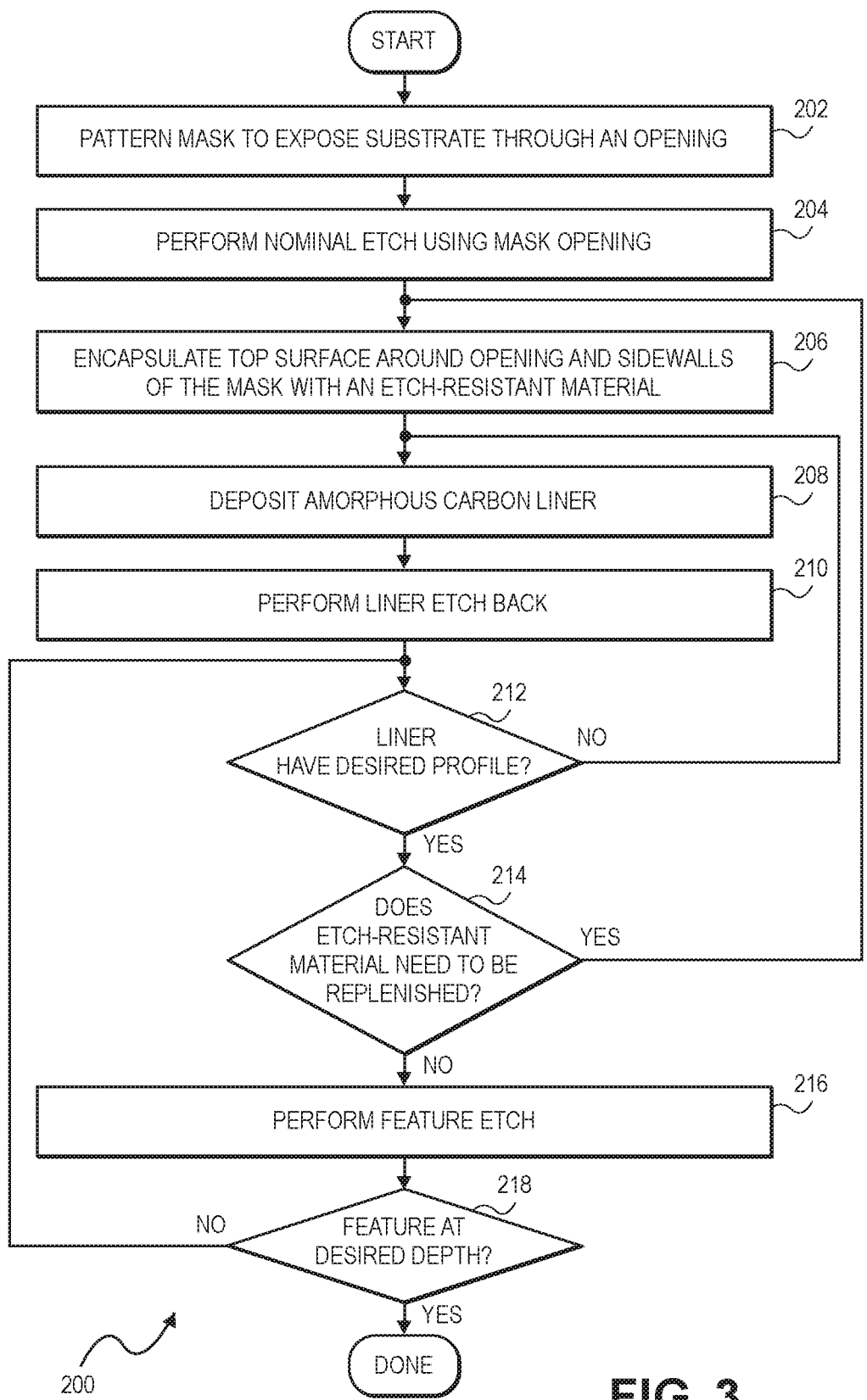
FIG. 3 is flow diagram illustrating processing steps for fabricating one or more features on a semiconductor substrate in accordance with another non-exclusive embodiment of the present invention.

Referring to FIG. 3, a flow diagram 200 illustrating steps for encapsulating the layer(s) 12 defining the mask for defining the features 14 is shown.

In the initial step 202, the one or more layers 12 are deposited or otherwise formed on the substrate 10. The one or more layer(s) 12 are then patterned to form a mask, exposing portions of the underlying substrate 10 where the features 14 are to be fabricated.

In step 204, a nominal etch is performed to create one or more features 14 (e.g. see the diagram labeled "nominal etch" in FIG. 2).

In step 206, the one or more layer(s) 12 defining the mask are encapsulated in an etch-resistant material. The encapsulation is typically performed using one of several well known substrate processing techniques. For instance, depending on the material, the encapsulation layer can be either grown or deposited onto the one or more layer(s) 12.

In step 208, the amorphous carbon liner 20 is deposited onto the sidewalls 18 of the nominal etch defining the features 14.

In step 210, the etch-back of the amorphous carbon liner 20 is performed. Again, the purpose of this etch-back step is to prevent a pinch-off condition at the opening or neck of the features 14. By clearing the neck and preventing pinch-off, at least two benefits are realized. First, the amorphous carbon liner 20 has the ability to deposit more uniformly on the sidewalls 18, and penetrate deeper into the depth of the features 14. Second, with a deeper and more uniform liner 20, the subsequent feature etch (as described below) may continue for a longer period of time before the liner 20 needs to be replenished. As a result, the feature 14 can be etched to a deeper depth.

The specific encapsulation material used in step 206 is largely dependent on the liner material deposited on the sidewalls 18 of the features 14. With the deposition of an amorphous carbon liner 20 in step 208 for example, suitable etch chemistries used in step 210 may include oxygen ($O_2$), nitrous oxide ($N_2O$), carbon dioxide ($CO_2$), hydrogen ($H_2$), or a combination thereof. With these chemistries, etch-resistant materials suitable for encapsulating and protecting the layer(s) 12 of the mask may include, but are not limited to, silicon oxide ($SiO_2$), silicon nitride (SiN), and/or amorphous silicon, any of which may be formed using well-known techniques. For instance, oxides such as ($SiO_2$) and nitrides such as (SiN) are deposited as is well known. Alternatively, an oxide such as ($SiO_2$) can be grown, provided the underlying layer is a suitable material, such as amorphous silicon. The thickness of the etch-resistant materials used for encapsulation may widely vary. In various embodiments, the thickness may range from 0.5 nm to 50 nm.

It should be understood that the examples provided herein are merely exemplary and should not be construed as limiting. On the contrary, a wide variety of different materials may be used for forming the liners 20 on the sidewalls 18 of the features 14. Depending on the liner material used, different etch chemistries may be selected, which in turn, means different anti-etching encapsulation materials may be used as well.

It is further noted that the steps 208 and 210 do not necessarily have to be performed in the order shown (i.e., meaning one after the other). On the contrary, the etch back step 210 can be performed prior to, simultaneously with, or after the amorphous carbon liner 20 is deposited in step 208.

In decision 212, it is determined if the amorphous carbon liner 20 has the desired profile, which is typically characterized by (i) a desired thickness on sidewalls 18, (ii) a desired depth within the feature 14, or a combination of both (i) and (ii). In certain non-exclusive embodiments, the determination of the desired profile is ascertained from empirical data. By performing the amorphous carbon liner 20 deposition numerous times with multiple substrates, historical data can be used to determine the timing of when a desired profile is achieved. If it is determined that the desired profile has not been achieved, then the deposition continues as provided in step 208.

In step 214, it is determined if the etch-resistant material needs to be replenished or not. Again, this determination is typically made using empirical data. By reviewing historical data from the processing of multiple substrates 10, the need to replenish can generally be made based on the a combination of the type of etchant chemistries used and/or an accumulated amount of time the etch-resistant material has been exposed to etchant chemistries during one or more iterations of the etch-back step 210. When it is determined that the etch-resistant material needs to be replenished, control may be returned to step 206.

Again, it should be understood that the order of decisions 212 and 214 may vary. Both decisions can be made at substantially the same time, or alternatively, one may occur before the other, with 212 occurring first and 214 occurring second, or vice-versa.

In step 216, a feature etch is performed when the amorphous carbon liner 20 has the desired profile and there is no need to replenish the etch-resistant material. As the feature etch is performed, the features 14 are etched to a deeper depth. Again, with a deeper and more uniform liner 20, the feature etch may continue for a longer period of time than otherwise possible before the liner 20 needs to be replenished. As a result, the feature 14 can be etched to a deeper depth, and potentially fewer iterations of the above process are needed.

In step 218, it is determined if the features are etched to a desired depth. This determination is also typically made using empirical data. If the features 14 have reached their desired depth, then the process is complete. If not, then control is returned to decisions 212 and/or 214. Depending on the outcome of these two decisions, reiterations of the amorphous carbon liner in step 208, the liner etch-back in step 210 and/or the replenishing of the etch-resistant material in step 206 may be performed before another iteration of the feature etch in step 218 is performed. In this way, the carbon liner 20 is replenished to meet a desired profile prior to another feature etch in step 216, the neck of the featured 14 is maintained opened and clear of excess material, while the etch-resistant material is replenished when appropriate to protect the mask layer(s) 12 from degradation.

With steps and decisions defined by the flow diagram 200, the features 14 can be etched to their desired depth. In situations when the desired depth is relatively deep (e.g., 4 microns or more), the feature etch step 216 may have to be reiterated multiple times. Similarly, depending on the outcome of the decisions 212 and 214, the deposition of the amorphous carbon liner 20 and/or the liner etch back of step 210 may also be reiterated multiple times. For example, if the liner 20 degrades during a feature etch 216, then the etch can be stopped and steps 208 and 210 can be performed. Similarly, if during the etch-back step 210 it is determined that the etch-resistant material needs to be replenished, then the etch-back is stopped and the mask is re-encapsulated in step 206.

It is further noted that the many of the steps outlined in the flow chart 200 do not necessarily have to be sequentially performed (i.e., one after the other). On the contrary, many of these steps can be performed in parallel. For instance, steps 208 and 210 may be performed at the same time or partially overlapping.

Figure 4:
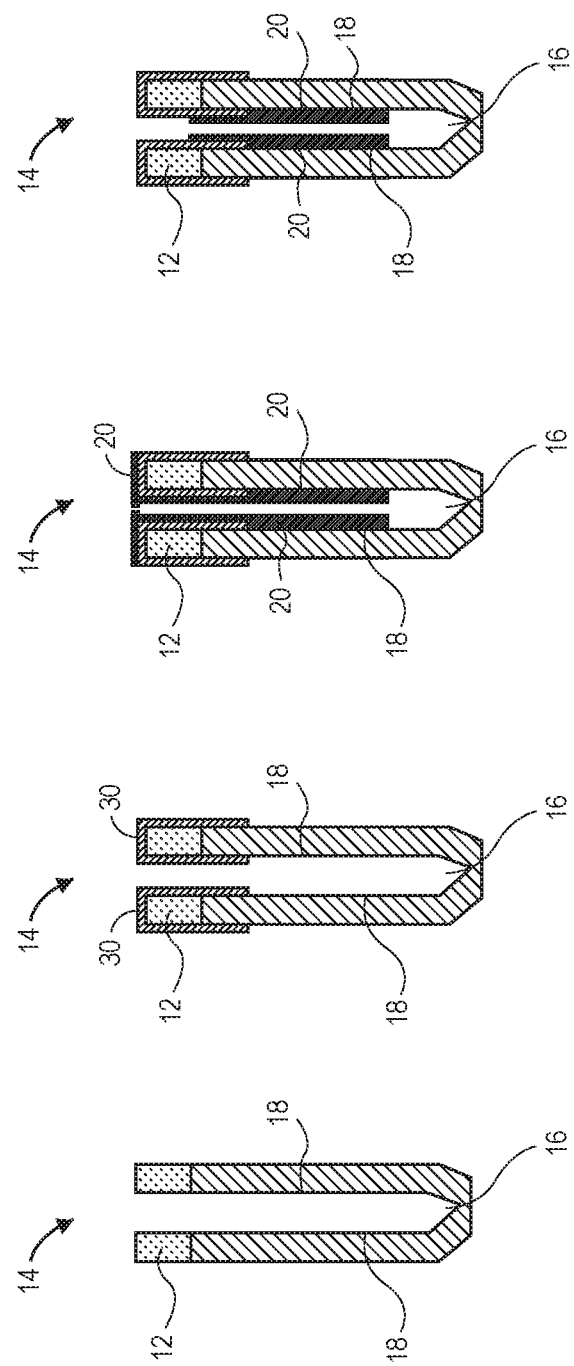
FIGS. 4A-4D are a series of diagrams illustrating the encapsulation of a mask to prevent degradation during fabrication of high aspect ratio features in accordance with the flow diagram of FIG. 3.

Referring to FIGS. 4A-4C, a series of diagrams illustrating the encapsulation of a mask to prevent degradation during fabrication of high aspect ratio feature 14 in accordance with the flow diagram 200 of FIG. 3 is illustrated.

In FIG. 4A, the feature 14 is nominally etched to a nominal depth 16 as illustrated. The location of the feature 14 was specified by the mask opening defined by the one or more mask layer(s) 12 per step 204 of FIG. 3.

In FIG. 4B, the etch-resistant material 30 is deposited and/or grown so as to encapsulate the layer(s) 12 defining the mask per step 206 of FIG. 3. As illustrated, the etch-resistant material 30 encapsulates not only the top surface around the opening defining the feature 14, but also along the sidewalls of the layer(s) 12 defining the neck of feature 14.

In step 4C, the amorphous carbon liner 20 is deposited on the top surface of the layers 14, along the sidewalls of the layer(s) 12. During the deposition, the amorphous carbon material may encroach into the opening and/or the neck of the feature 14, capping or pinching off access to the depth of the feature 14.

In FIG. 4D, the amorphous carbon material encroaching onto the neck or opening and on the sidewalls of the layer(s) 12 is substantially removed by the etch-back step 210 of FIG. 3. As evident in the figure, the neck of the feature 14 is cleared of excess amorphous carbon material, providing a clear entry profile for both the deposition of the amorphous carbon and chemistries used to perform the feature etch in step 216 into the depths of the feature 14.

The encapsulation of the layer(s) 12 defining the mask for feature 14 with the etch-resistant material realizes a number of advantages. First, the etch-back step 210 can be performed for a longer period of time relative to if the mask had not been encapsulated. Second, with the neck of the feature 14 substantially opened, the entry profile enables amorphous carbon to be deposited deeper into and more uniformly on the sidewalls 18 of the feature 14. Third, the feature etch in step 216 can also be performed for a longer period of time, resulting in a deeper etch of the feature 14, because the amorphous carbon liner needs to be replenished less often.

Substrate Processing Tools

The above-described process involves a number of deposition and etching steps. In various implementation embodiments, these deposition and etching steps can be steps can be perform in a combination of processing chambers or in a single processing chamber.

Figure 5:
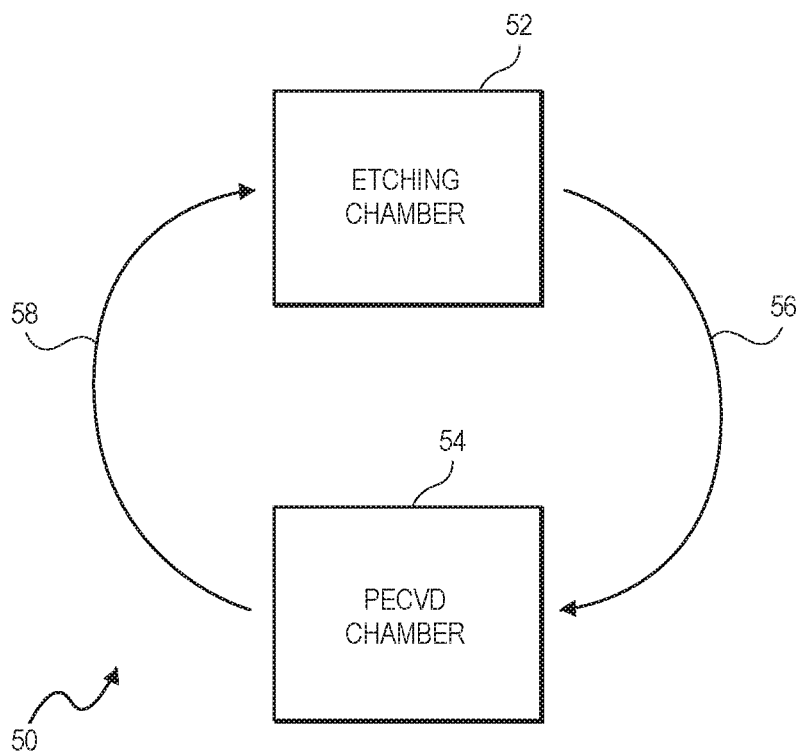
FIG. 5 is a diagram illustrating the iterative processing of (a) vertical etching and (b) deposition of the amorphous carbon liner using separate etching and Plasma Enhanced Chemical Vapor Deposition (PECVD) tools in accordance with a non-exclusive embodiment of the invention.

FIG. 5 is a diagram 50 illustrating an etching chamber 52 and a PECVD chamber 54 performing for the various processing steps as described herein. In one non-exclusive embodiment, the etch steps 204, 216 are performed in the etching chamber 52, while the deposition steps 206, 208 are performed in the PECVD chamber 54. The circular arrows 56, 58 are intended to show the iterative nature of the above described process, with the substrate 10 transported between the two chambers as needed depending on the process steps to be performed.

In variations of this embodiment, the two chambers 52 and 54 can be provided on the same tool or separate tools. In either case, the substrate 10 under processing is transported between the two chambers 52 and 54.

In various other embodiments, commercially available tools may be used such as the Kiyo or Flex etch tools and/or the Vector deposition tools commercially offered by the assignee of the present application In yet other variations of this embodiment, the etch-back step 210 can be performed in either chamber 52 or 54. In the case of the former, the substrate 10 is transported between the two chambers 52, 54 to perform the amorphous carbon liner 20 deposition of step 208 and the etch-back of step 210. In the case of the latter, both steps 208, 210 can be performed in the same chamber PECVD 54, either simultaneously or one after the other (i.e., step 208 first, step 210 second or vice versa).

Figure 6:
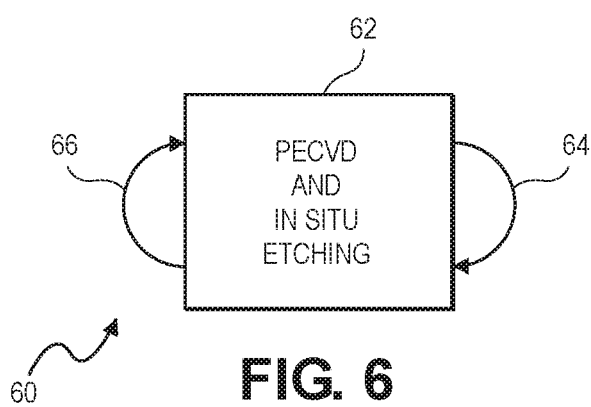
FIG. 6 is a diagram illustrating the iterative processing of (a) etching and (b) deposition of the amorphous carbon liner in situ a single tool in accordance with a non-exclusive embodiment of the invention.

Referring to FIG. 6, a PECVD tool 60 with the ability to perform in situ the same chamber 62 both etching and deposition operations is illustrated. With this embodiment, the nominal etch step 204, encapsulation step 206, amorphous carbon deposition step 208, etch-back step 210 and feature etch of step 216 are all or mostly all performed in the same chamber 62, eliminating or reducing the need to transport the substrate 10 between multiple chambers. Again, the iterative nature of many of the above steps is represented by the arrows 64, 66 in the diagram.

Exemplary PECVD Tool

Figure 7:
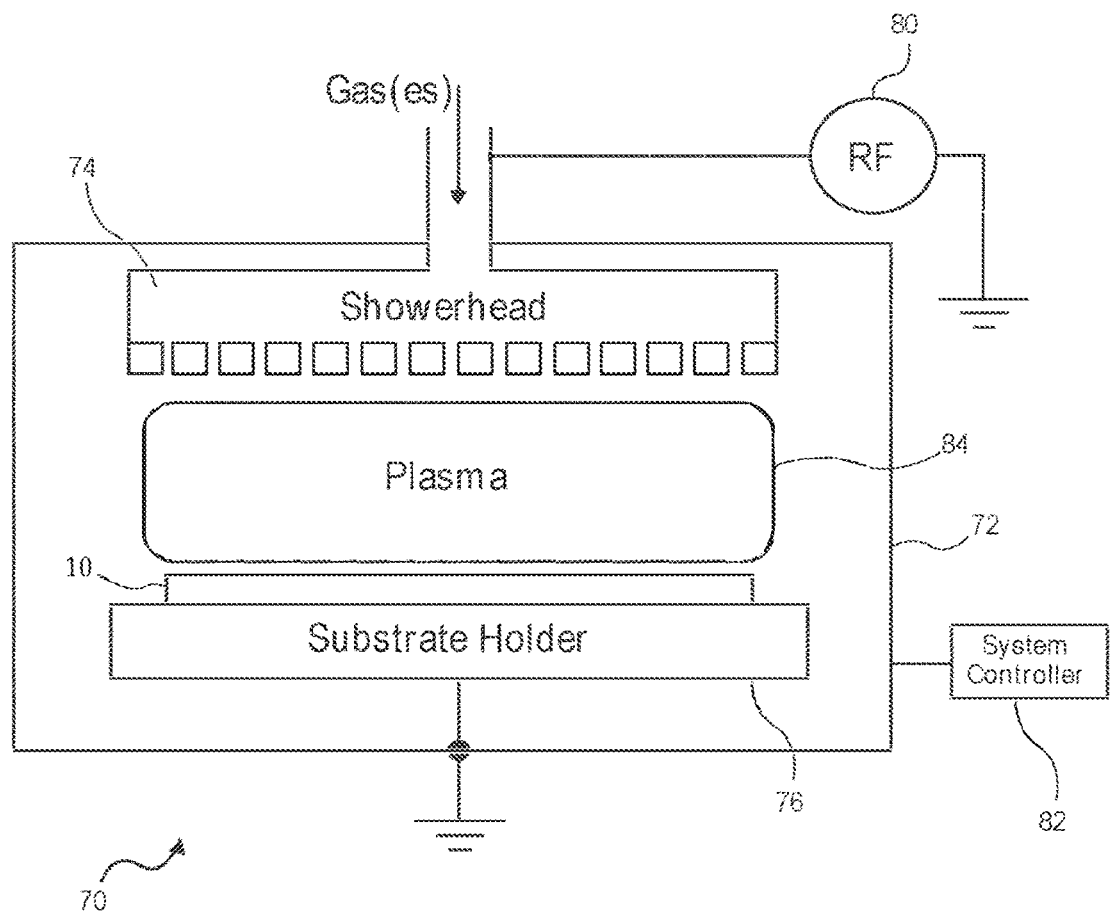
FIG. 7 is a diagram of an exemplary PECVD tool that could be used for the (b) deposition of the amorphous carbon liner in accordance with a non-exclusive embodiment of the invention.

FIG. 7 is a diagram of an exemplary PECVD tool 70 that could be used for any or all of the deposition steps 206, 208 and/or the etching steps 204, 210 and 216 is illustrated.

The CVD tool 70 includes a processing chamber 72, a shower head 74, a substrate holder 76 for holding and positioning a substrate 10 to be processed, a Radio Frequency (RF) generator 80, and a system controller 82.

During operation, reactant gas(es) are supplied into the process chamber 72 through the shower head 74. Within the shower head 74, the gas(es) is/are distributed via one or more plenums (not illustrated) into the chamber 72, in the general area above the surface of the semiconductor substrate 10 to be processed. An RF potential, generated by the RF generator 80, is applied to an electrode (not illustrated) on the shower head 74. (An RF potential may also possibly be applied via an electrode, also not shown, provided on to the substrate holder 76.) The RF potential generates a plasma 84 within the processing chamber 72. Within the plasma 84, energized electrons ionize or dissociate (i.e., "crack") from the reactant gas(es), creating chemically reactive radicals. As these radicals react, they deposit form thin films on the semiconductor substrate 10, including the amorphous carbon liner 20 as described herein.

The plasma 84 within the chamber 72 can be sourced either capacitively or inductively.

In various embodiments, the RF generator 80 may be a single RF generator or multiple RF generators capable of generating high, medium and/or low RF frequencies. For example, in the case of high frequencies, the RF generator 80 may generate frequencies ranging from 2-100 MHz and preferably 13.56 MHz or 27 MHz. When low frequencies are generated, the range is 50 KHz to 2 MHz, and preferably 350 to 600 KHz.

System Controller

Figure 8:
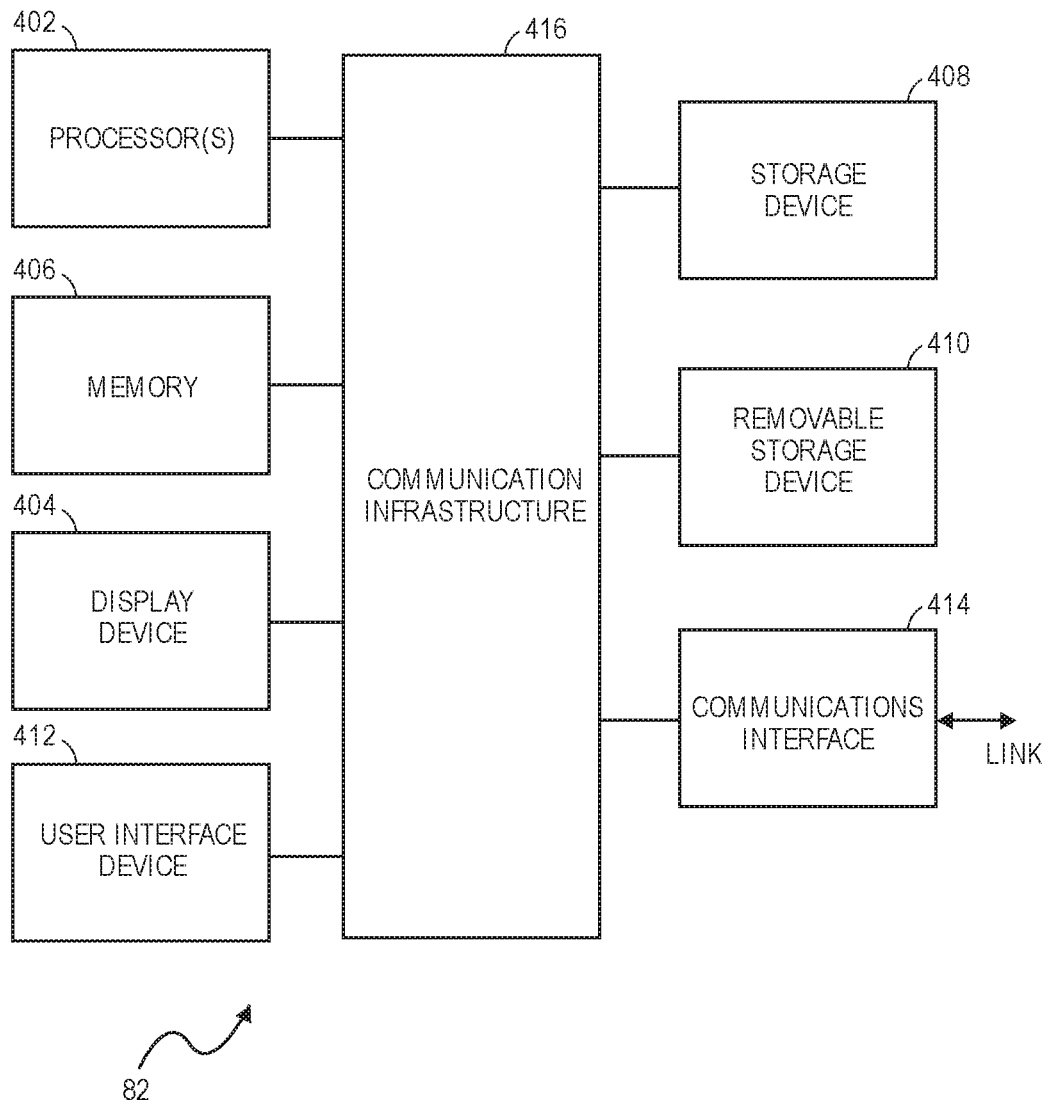
FIG. 8 is a block diagram of a system controller used for controlling an ALD tool in accordance with a non-exclusive embodiment of the invention.

Referring to FIG. 8, a block diagram of the system controller 82 in accordance with a non-exclusive embodiment of the invention. The system controller 82 is used to control the overall operation of the PEALD tool 70 in general and manage process conditions during deposition, post deposition, and/or other process operations.

The system controller 82 may have many physical forms ranging from an integrated circuit, a printed circuit board, a small handheld device, personal computer, server, a super computer, any of which may have one or multiple processors. The system controller 82 further can include an electronic display device 404 (for displaying graphics, text, and other data), a non-transient main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the system controller 82 and external devices via a link. The system controller 82 may also include a communications infrastructure 416 (e.g., a communications bus, cross-over bar, or network) to which the aforementioned devices/modules are connected.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals.

In certain embodiments, the system controller 82, running or executing system software or code, controls all or at least most of the activities of the tool 70 for implementing some or all of the processes as described herein, including but not limited to such activities as implementing the some or all of the steps as described in FIGS. 1 and 3, controlling the timing and decision making of the processing of such operations, frequency and power of operations of the RF generator 80, pressure within the processing chamber 72, flow rates of reactants, concentrations and temperatures within the process chamber 72, timing of purging the processing chamber, etc.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network. Furthermore, method embodiments may execute solely upon the processors or may execute over a network such as the Internet, in conjunction with remote processors that shares a portion of the processing.

Deposition of the Amorphous Carbon Liner

A wide variety of process flow and can be used within either a dedicated PECVD chamber and/or a dual-purpose etch and PECVD chamber to deposit the amorphous carbon liner 20. Such process flows involve defining within the processing chamber a temperature range, a pressure range, how a plasma is source, controlling flow rates of gases into the processing chamber, and the actual precursors and other chemistries actually used within the processing chamber.

In Table I provided below, the examples and/or ranges are provided for each of the parameters listed above. By using these examples and/or ranges, a PECVD process can be used to deposit the amorphous carbon liner 20 on the sidewalls 18 of the features 14.

TABLE I

| Process Parameter | Ranges/Examples/Comments |
|---|---|
| Substrate Temperature: | −60° to 700° C. |
| Pressure: | 50 milli-Torr to 10 Torr |
| Plasma Source: | Inductive or Capacitive |
| Precursor(s): | Aliphatic Hydrocarbons such as propylene, acetylene, methane, ethene, cyclohexane, etc. Aromatic hydrocarbons such as, toluene. Other hydrocarbon (CxHy) chemistries. |
| Other process gasses | Argon, helium, nitrogen. |
| Flow rates: | 0.1 to 10 Standard Liters Per Minute (SLMs) |
| Duration of deposition: | Can range to a few seconds to a number of minutes. Highly dependent on a wide variety of factors including desired vertical depth, desired aspect ratio and/or shape of feature 14, CD tolerance, type of deposition tool |

By no means should any of the information provided in the Table II above be construed as limiting. On the contrary, it should be understood that the various ranges, examples and factors used to define the duration of a given deposition are merely exemplary. Other ranges, examples and factors can be used for the deposition of the amorphous carbon liner 20 as needed to meet particular design objectives and process parameters.

Amorphous Carbon

Amorphous carbon, deposited to form the liner 20 on the sidewalls 18 of features 14, is preferably a free, reactive carbon that has no to little crystalline structure. Amorphous carbon materials may be stabilized by terminating dangling-TT bonds with hydrogen. Amorphous carbon is often abbreviated to "aC" for general amorphous carbon, "HAC" for hydrogenated amorphous carbon, or to "ta-C" for tetrahedral amorphous carbon, sometimes referred to as diamond-like carbon. Within the context of the present application, any of these types of amorphous carbons may be used for defining the liner 20 on the sidewalls 18 of the features 14.

The properties of the amorphous carbon liner 20, as used herein, vary depending on the parameters used during deposition. The primary method for characterizing amorphous carbon is through the ratio of $sp^2$ to $sp^3$ hybridized bonds present in the material. Graphite consists purely of $sp^2$ hybridized bonds, whereas diamond consists purely of $sp^3$ hybridized bonds. Materials that are high in $sp^3$ hybridized bonds are referred to as tetrahedral amorphous carbon, owing to the tetrahedral shape formed by $sp^3$ hybridized bonds, or as diamond-like carbon (owing to the similarity of many physical properties to those of diamond). In addition, the amount or degree of hydrogen in the amorphous carbon liner 20 can be readily measured using spectrometry, for example, Rutherford Backscattering Spectrometry (RBS). The ability to detect levels of hydrogen is particularly beneficial when performing steps to densify the amorphous carbon liner 20 as described above.

Etch-Back Step

In Table II provided below, the exemplary values and/or ranges are provided for a number of the parameters that may be implemented in a processing chamber for performing the liner mask etch-back step 210. By using these values and/or ranges, an etch back process can be used to remove excess amorphous carbon material at the top, opening or neck of the feature 14 defined by the mask (i.e., the layer(s) 12).

TABLE II

| Process Parameter | Ranges/Examples/Comments |
|---|---|
| Substrate Temperature: | −60° C. to 550° C. |
| Pressure: | 5 millitorr to 6 torr |
| Plasma Source: | Inductive or Capacitive |
| Precursor(s): | nitrous oxide ($N_2O$), carbon dioxide ($CO_2$), Oxygen ($O_2$), hydrogen ($H_2$), other oxygen containing species or a combination thereof. Also, other diluents can be used, such as nitrogen ($N_2$). |
| RF | 13.56 MHz or anywhere in the range of 400 KHz to 60 MHz. |
| Flow rates: | 5 standard cubic centimeters per minute (sccm) to 10 standard liter per minute (slm) |
| Plasma wattage | 100 Watts or anywhere in the range of 25 Watts to 1 KWatts. |
| Duration of etch: | 5 seconds to 300 seconds |
| Amount of material removal | 2 to 50 nanometers |

The above-defined process parameters result in the use of a chemistry that enables the "gentle" etching of amorphous carbon, in a highly controlled manner By generating a relatively low power plasma, oxygen and/or other radicals (e.g. carbon or nitrogen) form a volatile etchant that reacts with the amorphous carbon of the liner 20 at the top or opening of the feature 14. At high RF, the ion energy bombarding the surface of the layer(s) 12 defining the mask is relatively low, resulting in a relatively slow etch rate. The etch is therefore predominately a chemical etch. Most of the radicals immediately react when contacting the pinch off material, resulting in an etching byproduct that is pumped out of the processing chamber. Since the radicals have low energy, and tend to react immediately with the pinch off material or with material of the amorphous carbon liner 20 immediately below the opening defined by the mask (e.g., 400 nanometers of depth or less), relatively few of the radicals have the opportunity to diffused downward into the depth of the feature 14. As a result, most of the liner 20 remains intact, largely unaffected by the etch in the vicinity of the layer(s) 12, removing mostly the pinch off material and opening the neck of the feature 14, but generally does not penetration into the depth of the feature 14 itself. Consequently, the liner 20 on the sidewalls of the features 14 substantially remains intact and remains largely unaffected by the back-etch 210.

Feature Characteristics/Dimensions

By using the process as described herein, semiconductor substrates with features 14, with extremely high aspect ratios, and very tight CD control, can be realized. For example, features 14 having depths of four (4) microns or more, aspect ratios of greater than or equal to (50:1) and tight CDs in the range of 80-100 or 150 nanometers or less, can be realized. It should be understood that these characteristics are merely exemplary. Features 14 can be fabricated with vertical depths that are deeper or less deep, with larger or smaller aspect ratios and/or tighter or less tight CD measurements. As a general rule however, as semiconductor fabrication technologies improve, and the demand for ever more dense semiconductor devices continues, features 14 that are deeper, have higher aspect ratios and even tighter CD measurements are likely to be realized using the subject matter as described herein.

Although only a few embodiments have been described in detail, it should be appreciated that the present application may be implemented in many other forms without departing from the spirit or scope of the disclosure provided herein. Therefore, the present embodiments should be considered illustrative and not restrictive and is not to be limited to the details given herein, but may be modified within the scope and equivalents of the appended claims.

What is claimed is:

1. A method for fabricating a feature into a semiconductor substrate, the method comprising:
   (a) encapsulating with an etch-resistant material around an opening and sidewalls of a mask defining the feature nominally etched into the semiconductor substrate;
   (b) depositing an amorphous carbon liner on the sidewalls of the mask and sidewalls of the feature;
   (c) performing an amorphous carbon liner etch for removing excess amorphous carbon deposited around the opening or the sidewalls of the mask during the deposition of the amorphous carbon liner, the etch-resistant material preventing or mitigating etching of the around the opening and the sidewalls of the mask during the amorphous carbon liner etch; and
   (d) performing a feature etch to deepen a depth of the feature into the semiconductor substrate.

2. The method of claim 1, further comprising repeating (d) one or more times until the feature has been etched to a desired depth into the semiconductor substrate.

3. The method of claim 1, further comprising repeating (b) and (d) each one or more times until the feature has been etched to a desired depth into the semiconductor substrate.

4. The method of claim 1, further comprising periodically repeating (a) to replenish the etch-resistant material around the opening and the sidewalls of the mask.

5. The method of claim 1, wherein the amorphous carbon liner is resistant to lateral etching of the feature during the feature etch.

6. The method of claim 1, wherein the amorphous carbon liner enables a tighter critical dimension control (CD) of the feature during the feature etch relative to performing the feature etch without the amorphous carbon liner.

7. The method of claim 1, wherein the encapsulation with the etch-resistant material enables one or more of the following:
   (i) the amorphous carbon liner etch to occur for a longer period of time before degrading the mask relative to if the mask had not been encapsulated;
   (ii) the amorphous carbon liner to be deposited deeper into the feature and more uniformly on the sidewalls of the feature because excess amorphous carbon deposits is removed around the opening and the sidewalls of the mask during the amorphous carbon liner etch; or
   iii) the feature etch is performed deeper because the amorphous carbon liner needs to be replenished less often because it extends deeper and more uniformly on the sidewalls of the feature.

8. The method of claim 1, wherein the mask is one of the following:
   (i) an Ashable HardMask (AHM);
   (ii) a carbon mask; or
   (iii) a doped material.

9. The method of claim 1, wherein the etch-resistant material is etch-resistant to chemistries used to etch amorphous carbon.

10. The method of claim 1, wherein the etch-resistant material is one of the following:
    (i) silicon nitride;
    (ii) silicon oxide; or
    (iii) a combination of (i) and (ii).

11. The method of claim 1, prior to (a), further comprising:
    providing a mask material onto the semiconductor substrate;
    patterning the mask to define the feature; and performing a nominal etch, using the mask, the nominal etch defining the feature in the substrate prior to encapsulation of the mask.

12. A substrate processing tool, comprising:
    a processing chamber;
    a substrate holder for holding a substrate for processing in the processing chamber; and
    a controller arranged to execute instructions for controlling processing steps within the processing chamber for processing the substrate, the controller arranged to:
    (a) encapsulate with an etch-resistant material around an opening and sidewalls of a mask defining a feature nominally etched into the substrate;
    (b) deposit an amorphous carbon liner on the sidewalls of the mask and sidewalls of the feature;
    (c) perform an amorphous carbon liner etch for removing excess amorphous carbon deposited around the opening or the sidewalls of the mask during the deposition of the amorphous carbon liner.

13. The substrate processing tool of claim 12, wherein the controller is further configured to repeat (b) and (c) one or more iterations to replenish the amorphous carbon liner.

14. The substrate processing tool of claim 12, wherein the controller is further configured to repeat (a) to replenish the etch-resistant material around the opening and the sidewalls of the mask.

15. The substrate processing tool of claim 12, wherein the controller is further configured to repeat (b) and (c) one or more cycles to achieve a desired profile of the opening and the sidewalls of the mask.

16. The substrate processing tool of claim 12, wherein the controller is further configured to perform (b) and (c) one or more cycles to achieve a desired profile of the amorphous carbon liner.

17. The substrate processing tool of claim 16, wherein the desired profile is characterized by:
  (i) a desired uniformity of thickness of the amorphous carbon liner,
  (ii) a desired depth of the amorphous carbon liner within the feature; or
  (iii) both (i) and (ii).

18. The substrate processing tool of claim 12, wherein the etch-resistant material is etch-resistant to chemistries used to etch amorphous carbon.

19. The substrate processing tool of claim 12, wherein the etch-resistant material is one of the following:
  (i) silicon nitride;
  (ii) silicon oxide; or
  (iii) a combination of (i) and (ii).

20. The substrate processing tool of claim 12, wherein the controller is further configured to perform the nominal etch of the feature and one or more feature etch cycles to deepen the feature to a desired depth.

\* \* \* \* \*